United States Patent
Bohnert et al.

[19]

[11] Patent Number: 5,953,121
[45] Date of Patent: Sep. 14, 1999

[54] MAGNETO-OPTIC CURRENT SENSOR HAVING A MECHANICALLY STRESS-FREE λ/4 ELEMENT

[75] Inventors: Klaus Bohnert, Niederrohrdorf; Hubert Brändle, Oberengstringen, both of Switzerland; Tone Schanke, Oslo, Norway

[73] Assignee: ABB Research Ltd., Zurich, Switzerland

[21] Appl. No.: 08/986,191

[22] Filed: Dec. 5, 1997

[30] Foreign Application Priority Data

Jan. 29, 1997 [DE] Germany .............. 197 03 128

[51] Int. Cl.⁶ ...................................... G01B 9/02
[52] U.S. Cl. ............... 356/345; 250/227.19; 324/244.1
[58] Field of Search ...................... 356/345, 350; 385/12; 250/227.19, 227.27; 324/244.1

[56] References Cited

U.S. PATENT DOCUMENTS

| | | | |
|---|---|---|---|
| 5,492,552 | 2/1996 | Cronk et al. .............. | 65/504 |
| 5,500,909 | 3/1996 | Meier ....................... | 385/12 |
| 5,644,397 | 7/1997 | Blake ....................... | 356/345 |
| 5,696,858 | 12/1997 | Blake ....................... | 385/12 |

FOREIGN PATENT DOCUMENTS

| | | |
|---|---|---|
| 2445369 | 11/1975 | Germany . |
| 2855337C2 | 7/1980 | Germany . |
| 4224190A1 | 1/1994 | Germany . |
| 4304762A1 | 8/1994 | Germany . |

OTHER PUBLICATIONS

Optical Fibre Sensors, 10th International Conference, International Society for Optical Engineering, vol. 2360, Oct. 1994.

"Reciprocal reflection interferometer for a fiber–optic Faraday current sensor", Frosio, et al., Applied Optics, vol. 33, No. 25, Sept. 1994, p. 6111–6122.

*Primary Examiner*—Samuel A. Turner
*Attorney, Agent, or Firm*—Burns, Doane, Swecker & Mathis, L.L.P.

[57] ABSTRACT

Without special measures, a fiber-optic current sensor coil (11) and fiber-optic λ/4 time delay elements (9, 9'), which are connected in series with the current sensor coil (11), are temperature-dependent with respect to a relative phase lag of light passing through. In order to avoid a temperature correction or temperature compensation, the current sensor coils (11) and, if appropriate, also the λ/4 time delay elements (9, 9') are annealed, so that virtually no mechanical stresses remain in the optical fibers. The current sensor coil (11) is preferably mounted unrestrained in a capillary (20) filled with a protective gas. The capillary (20) is embedded in a gastight fashion in a potting compound (22) made from polyurethane, and is thus also mechanically protected.

10 Claims, 2 Drawing Sheets

MAGNETO-OPTIC CURRENT SENSOR HAVING A MECHANICALLY STRESS-FREE λ/4 ELEMENT

BACKGROUND OF THE INVENTION

1. Field of the Invention

The invention proceeds from a magneto-optic current sensor according to the preamble of Patent Claim 1.

2. Discussion of Background

With the preamble of patent claim 1, the invention refers to a prior art such as is known from a publication by K. B. Bohnert, H. Brandle and G. Frosio: FIELD TEST OF INTERFEROMETRIC OPTICAL FIBER HIGH-VOLTAGE AND CURRENT SENSORS, Tenth International Conference on OPTICAL FIBRE SENSORS, Glasgow, Scotland, Oct. 11–13, 1994, pages 16 to 19, published by SPIE—The International Society for Optical Engineering, Volume 2360. There, a fiber-optic current sensor is specified in which laser light passes via a fiber coupler and a fiber polarizer to a Y-coupler at which it is split in two linearly polarized component waves. The first wave runs via a phase modulator, an optical fiber approximately 90 m long, which maintains the linear polarization, to a first λ/4 fiber loop. The linear polarization is tranverses in the loop into a circular polarization. The circularly polarized light traverses a fiber-optic sensor coil with a diameter of 42 cm and 20 turns, which has a relatively low birefringence. The laser light emerging from the sensor coil, still circularly polarized in the ideal case, is transformed back again into linearly polarized light in a second λ/4 fiber loop, and runs back to the Y-coupler via a further polarization-maintaining glass fiber approximately 90 m long and the phase modulator. The second component wave traverses the optical circuit with the same polarization states in the opposite direction. The two returning waves are brought to interfere in the Y-coupler. The resulting interference signal passes to a photodiode via the fiber polarizer and the fiber coupler. The magnetic field of the electric current, which is surrounded by the fiber coil, generates an optical phase shift between the two oppositely directed light waves in the coil. The phase shift is detected as a corresponding change in the interference signal. The bending-induced, linear birefringence of the λ/4 loops, and thus the relative phase lag, are a function of temperature. The linear birefringence of the fiber coil likewise varies with temperature. These effects are strongly marked particularly in the case of low temperatures, because in this case the plastic protective cladding of the fiber is usually hardened and generates additional birefringence. The measuring sensitivity of the sensor changes as a result. These effects often exhibit a hysteresis-like behavior, and so this signal can scarcely be corrected exactly even when the temperature is known.

In a relatively limited temperature range between 0° C. and 70°, the relative phase lag varies in the case described by approximately 7° in the sensor coil and by 4° in the λ/4 loop. The relative measuring error was ±0.15% for a current of 900 A and a constant temperature.

DE-AS 2445369 discloses a magneto-optic measuring transducer for high-voltage current measurements, in which the optical fiber used as current sensor, made from glass and having an inside diameter of 57 μm, has a liquid core of hexachlorobuta-1,3-diene. The aim thereby is to eliminate the strongly temperature-dependent stress birefringence in the case of optical conductor coils made from graded-index fibers.

DE 4304762 A1 discloses a sensor head for a fiber-optic current-measuring device using a polarimetric detection method, without λ/4 time-delay elements, in which a twisted low birefringent LB fiber guided around a current conductor and made from silica glass is arranged in the interior of a capillary made from quartz and having a diameter in the range of 0.2 mm–0.5 mm and is held at the end virtually without force at fused splice points. The torsional stress on the LB fiber caused by the twisting is transmitted onto the capillary via the splice points and via bonded joints containing silicone. A plastic protective cladding normally surrounding the sensor fiber can, however, harden at low temperatures and cause disturbing birefringence. The light introduced into the sensor fiber is not guided in an oppositely directed fashion, with the result that interference effects from the sensor fiber do not compensate each other.

Reference may further be made to the publication by G. Frosio and R. Dändliker, Reciprocal reflection interferometer for a fiber-optic Faraday current sensor in: Applied Optics, Vol. 33, No. 25, Sep. 1, 1994, pages 6111 to 6122 for the relevant prior art. There, the sensor coil is mirrored at the end face. In this case, the same temperature dependencies occur as for the current sensor in the conference report named at the beginning.

SUMMARY OF THE INVENTION

Accordingly, one aspect of this invention as defined in Patent claim 1 is to develop a magneto-optic current sensor of the type mentioned at the beginning in such a way that its temperature dependence is negligible.

Advantageous embodiments of the invention are defined in the dependent patent claims.

One advantage of the invention consists in that it is possible to eliminate an expensive temperature compensation or correction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
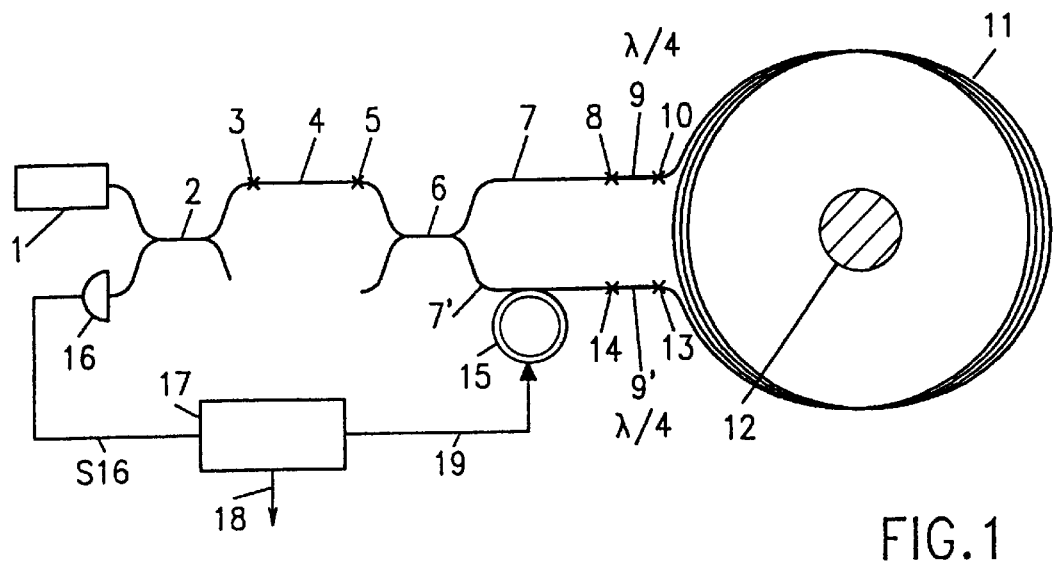
FIG. 1 shows a Sagnac interferometer with λ/4 time delay elements and a current sensor coil in a representation of the principle.

Referring now to the drawings, wherein like reference numerals designate identical or corresponding parts throughout the several views, FIG. 1 shows a Sagnac interferometer with a light source or a multimode laser (1), which transmits light to a fiber polarizer (4) via a first fiber coupler (2) and a first optical fiber splice (3). The linearly polarized light emerging from the fiber polarizer (4) passes via a second optical fiber splice (5) to a second fiber coupler (6), where it is split into 2 component waves. Via a polarization-maintaining, optical feeder fiber (7) with a round or, preferably, elliptical cross section of the fiber core, and a third optical fiber splice (8), the first component wave runs to a $\lambda/4$ time delay element (9) made from a further optical fiber with a strongly elliptical cross section of a fiber core (31) with a typical ratio of the main axes of 2:1. From this $\lambda/4$ time delay element (9), the light, circularly polarized, via a fourth optical fiber splice (10), enters a fiber-optic current sensor coil (11) with a small linear birefringence, made from a magneto-optically active material such as silica glass, for example, and having a plurality of turns around a current conductor (12). From this current sensor coil (11), the circularly polarized light enters, via a fifth optical fiber splice (13), a second $\lambda/4$ time delay element (9') which is identical to the $\lambda/4$ time delay element (9). Light emerging from this $\lambda/4$ time delay element (9') is linearly polarized again and passes back to the second fiber coupler (6) via a sixth optical fiber splice (14), via a polarization-maintaining optical return fiber (7') with a round or, preferably, elliptical cross section of the fiber core, and via a piezoelectric modulator or phase modulator (15). The second component wave, generated at the fiber coupler (6), traverses the optical circuit in the opposite direction. The two returning waves are brought into interference in the second fiber coupler (6). The optical interference signal runs to a light detector or a photodiode (16) via the second optical fiber splice (5), the fiber polarizer (4), the first optical fiber splice (3) and the first fiber coupler (2). On the output side, the photodiode (16) supplies an optical intensity signal (S16), proportional to the received light intensity, to a signal processor (17) which makes a current signal (18) available as the measurement result on the output side and, furthermore, supplies a modulation signal (19) to the phase modulator (15). This modulation signal (19) has a frequency in the range above 100 kHz; it serves to set the operating point of the Sagnac interferometer. It is preferable to set a phase shift of 90° corresponding to half the maximum intensity, at which a phase shift detected by means of the current sensor coil (11) effects as large as possible a change in the light intensity signal (S16).

The birefringence in the $\lambda/4$ time delay element (9, 9') which causes the optical phase lag is produced by the elliptical shape of the core cross section (31). Since the shape of the core is independent of temperature, the phase lag is likewise independent of temperature, that is to say the light emerging from the $\lambda/4$ time delay elements (9, 9') is always circularly polarized, independently of temperature.

If feeder and return fibers (7, 7') are used with a round core instead of with an elliptical one, the birefringence required for the maintenance of polarization must have been generated by a frozen, internal mechanical stress field.

Figure 2:
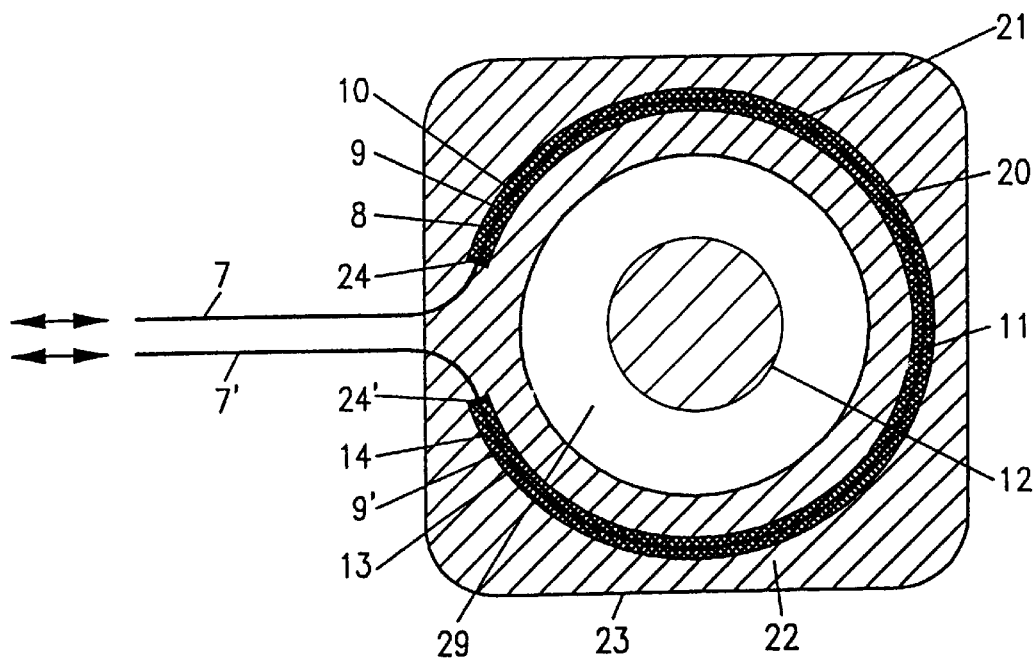
FIG. 2 shows an arrangement of the current sensor coil in accordance with FIG. 1 in a housing.

FIG. 2 shows an internally hollow sensor housing (23) which is arranged around the current conductor (12) and in which there is mounted in an unrestrained fashion, that is to say free from mechanical stress, a current sensor coil (11) with a fiber diameter of approximately 80 $\mu$m and having only one turn inside a cavity (21) of a circularly bent capillary (20) made from silica glass or a chromium-rich steel alloy such as, for example, Inconel. The current conductor (12) is arranged in this case in a central through opening (10) of the sensor housing (23). The current sensor fiber of the current sensor coil (11) is firstly pressed with its protective cladding into the capillary (20) with the aid of nitrogen gas at high pressure. Subsequently, alcohol is pressed into the capillary (20) and then detaches the protective cladding from the magneto-optic current sensor fiber, with the result that the protective cladding can be drawn as a whole out of the capillary (20), the naked current sensor fiber remaining in the capillary (20). Before installation in the sensor housing (23), the current sensor fiber of the current sensor coil (11) is annealed in its inserted and circularly curved state for more than 3 h at its softening temperature of approximately 830° C. so that it becomes largely free from mechanical stresses and thus is at least approximately free from linear optical birefringence. After the annealing, the cavity (21) is filled with a protective gas, preferably $SF_6$, and sealed in a gastight fashion by seals (24, 24') made from indium, silver or gold, for example, in order to prevent moisture and chemically aggressive vapors from being able to penetrate into the interior of the capillary (20). Also accommodated inside the cavity (21) are the $\lambda/4$ time delay elements (9) and (9') and parts of the optical feeder fiber (7) as well as of the return fiber (7'). The capillary (20) with an inner diameter of a few 100 $\mu$m is embedded in a potting compound such as is customary for electronic components, for example made from polyurethane or from a silicone foam; it serves as protection against disturbing mechanical and chemical influences.

It goes without saying that the current sensor coil (11) can have a plurality of turns, corresponding to FIG. 1. Instead of a protective gas, oil or a vacuum could also be present in the cavity (21). When oil is used, the capillary (20) can consist of a plastic and be pushed after annealing over the optical fiber of the current sensor coil (11). The task of the seals (24, 24') can also be taken over by the potting compound (22) if the latter is suitable for this.

Figure 3:
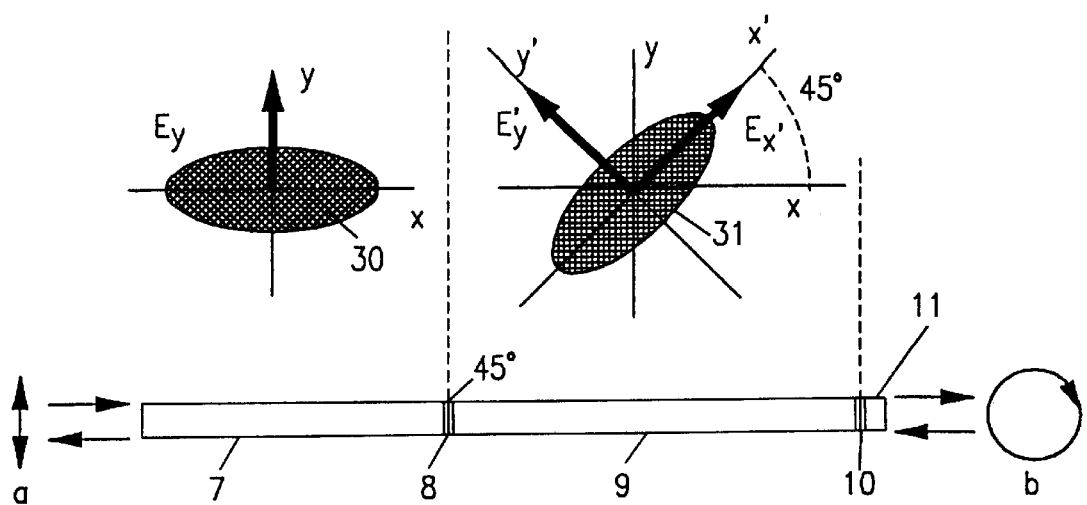
FIG. 3 shows cross sections of glass fiber cores and light amplitudes at a transition of a feeder fiber and a λ/4 time delay element.

FIG. 3 shows the non-curved, linear $\lambda/4$ time delay element (9) which is connected via the optical fiber splices (8) and (10) to the optical feeder fiber (7) and, especially, to the current sensor coil (11) ; a longitudinal section is shown below, and above that are the cross sections through the corresponding cores (30) and (31) of the optical fibers (7) and (9), respectively. A glass cladding is located around the fiber core (31) of the optical fiber (9); the plastic protective cladding usually located thereabove has been removed.

Designated by (x) and (y) are mutually orthogonal co-ordinate axes of the optical feeder fiber (7) with an elliptical core cross section in the direction of the major and minor axes thereof, while ($E_y$) denotes a light amplitude of a linearly polarized light (a) which is transmitted through the optical feeder fiber (7) in a fashion maintaining polarization, for example in the direction of the y-axis. Mutually orthogonal co-ordinate axes of the optical fiber of the λ/4 time delay element (9) with an elliptical core cross section (31) in the direction of the major and minor axes thereof are denoted by (x') and (y'), and ($E_{x'}$) and ($E_{y'}$) denote light amplitudes in the direction of the x'- and y'-axes, respectively. The axes (x') and (y') of the optical fiber of the λ/4 time delay element (9) are rotated with respect to the axes (x) and (y) of the optical feeder fiber (7) by 45°±ε, with the result that upon transition from the optical feeder fiber (7) into the λ/4 time delay element (9) the linearly polarized light (a) is split into 2 mutually orthogonal components ($E_{x'}$) and ($E_{y'}$) parallel to the optical main axes (x', y') of the λ/4 time delay element (9). The two polarization components propagate at a different phase velocity. The length of the λ/4 time delay element (9) is selected such that the two components accumulate a relative phase lag of 90°±δ, with the result that circularly polarized light emerges from the λ/4 time delay element (9). For light with a wavelength of 780 nm, the length of the λ/4 time delay element (9) is approximately 0.7 mm–2 mm, depending on the fiber type. The tolerance angles ε and δ are preferably to be <2°; ε may possibly be 15°, and δ possibly 25°. For a λ/4 time delay element (9) which was taken from a commercially available fiber, a tolerable temperature dependence of ±2° of the phase lag thereof was measured for an optical wavelength of 788 nm in a temperature range between –40° C. and 80° C. This remaining temperature dependence of the λ/4 time delay element (9) is the result, inter alia, of mechanical stresses between the fiber core and fiber cladding (not illustrated) thereof. These mechanical stresses can be largely reduced by irradiating the optical fiber (9) with ultraviolet light and/or by annealing at a temperature above 200° C.

The design of the λ/4 time delay element (9') corresponds to that of the λ/4 time delay element (9). The optical main axes (x', y') of the time delay elements (9) and (9') can be aligned arbitrarily with respect to the plane of the current sensor coil (11), whose fiber core has a round cross section. It is important that the optical main axes (x', y') of the λ/4 time delay elements (9, 9') form an angle of 45°±ε or –45°±ε with the optical main axes (x, y) of the feeder fiber (7) and the return fiber (7'), ε being a prescribable tolerance angle of <15°, preferably of <5°. The length of the fiber optic λ/4 time delay element (9, 9') is to be selected such that the polarization components parallel to the optical main axes (x', y') in the λ/4 time delay elements (9, 9') accumulate a phase difference of (2·m–1)·90°±δ, m being an integer and δ a prescribable tolerance angle of <25°, preferably of <10°.

Figure 4:
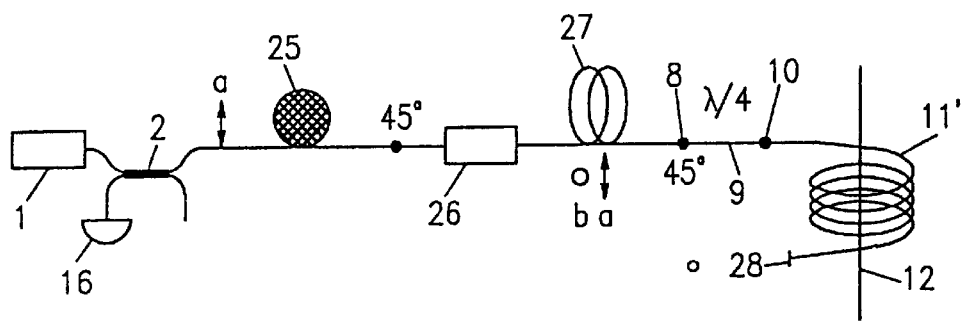
FIG. 4 shows a Sagnac interferometer with a λ/4 time delay element and a current sensor coil with a mirrored end face, in a representation of the principle.

FIG. 4 shows another embodiment of a Sagnac interferometer with a λ/4 time delay element (9) in accordance with FIGS. 1–3 and a current sensor coil (11') which has a mirrored end face and is mounted and annealed in the same way as the current sensor coil (11) described in conjunction with FIGS. 1 and 2. Via the fiber coupler (2), a fiber polarizer (25), a phase modulator (26), a strongly birefringent optical fiber (27) and the λ/4 time delay element (9), linearly polarized light is fed from the multimode laser (1) to the current sensor coil (11') and reflected from there at a mirrored end face (28) to the photodiode (16). The fiber polarizer (25) can be of the same construction as the fiber polarizer (4) in accordance with FIG. 1, and the phase modulator (26) can be the same as the phase modulator (15) there. The strongly birefringent optical fiber (27) is so long that the coherence of the light is lost therein.

Figure 5:
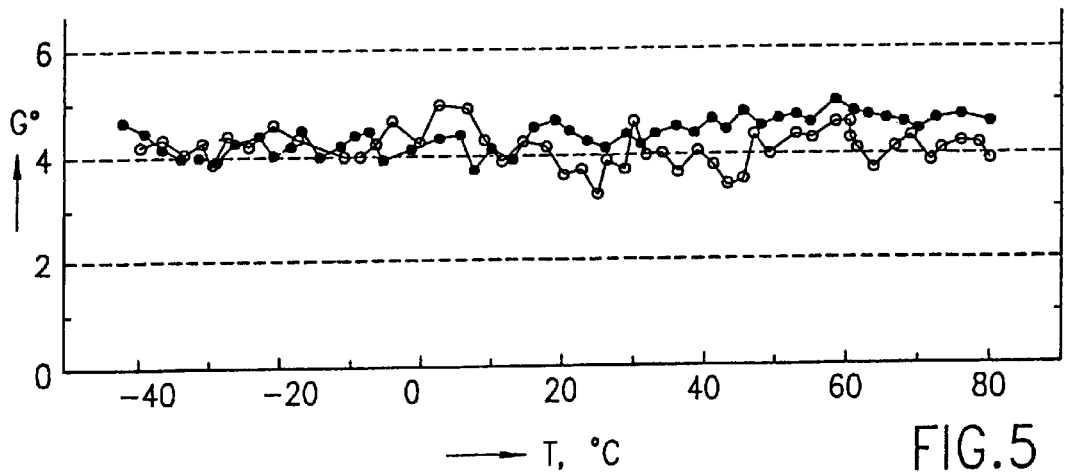
FIG. 5 shows the temperature dependence of a path difference, caused by linear birefringence, in a current sensor coil.

It is important that the current sensor coils (11) and (11') and preferably also the λ/4 time delay elements (9) and (9') are at least approximately free from mechanical stresses and thus dimensionally stable, with the result that with respect to their transmission characteristics for light they are virtually temperature-independent, at least in the envisaged field of application. The current sensor fibers of the current sensor coils (11) and (11') keep their curved shape if they were separated from the λ/4 time delay elements (9, 9') and the feeder and return fibers (7, 7'). A path difference (G) induced by birefringence, compare FIG. 5, is to be <20°, preferably <10°. The same holds for the λ/4 time delay element (9, 9').

It is important, furthermore, that circularly polarized light is guided in an oppositely directed fashion through the current sensor fibers of the current sensor coil (11, 11'), since interference effects such as are caused by mechanical vibrations, for example, are partially compensated thereby.

FIG. 5 shows the temperature dependence of a path difference (G) caused by linear birefringence, in degrees for a current sensor coil (11) with 7 turns and a diameter of 11.7 cm. The temperature (T) is plotted in °C. on the abscissa. The values of the path difference (G) measured with increasing temperature (T) are represented by circles, while those measured with decreasing temperature (T) are represented by points. Without annealing of the current sensor fiber, the measured, stress-induced path difference (G) amounted to approximately 80° (not represented). It was possible for the path difference (G) to be reduced to a value of 4° virtually independent of temperature by the thermal healing of the mechanical stresses in the current sensor fiber.

Obviously, numerous modifications and variations of the present invention are possible in the light of the above teachings. It is therefore to be understood that within the scope of the appended claims, the invention may be practiced otherwise than as specifically described herein.

What is claimed as new and desired to be secured by Letters Patent of the United States is:

1. A magneto-optic current sensor comprising:
   at least one λ/4 time-delay element comprising a single-mode fiber having an elliptical core cross section and optical main axes and being at least approximately mechanically stress-free;
   at least one current sensor coil with a current sensor fiber being optically connected with a first end of each at least one λ/4 time-delay element;
   at least one polarization-maintaining feeder or return fiber having mutually orthogonal optical main axes of birefringence, each at least one polarization-maintaining feeder or return fiber being optically connected to a second end of one of the at least one λ/4 time-delay element; and
   a capillary in which the current sensor fiber of the at least one current sensor coil is mounted without a protective cladding;
   wherein a) circularly polarized light is guided through the at least one current sensor fiber in opposite directions, b) the at least one current sensor fiber is at least approximately mechanically stress-free and dimensionally stable, and c) the optical main axes of each at least one λ/4 time delay element form an angle of (+45°±ε)

or (−45°±ε) with the optical main axes of the corresponding feeder or return fiber, ε being a prescribable tolerance angle.

2. The magneto-optic current sensor as claimed in claim 1, wherein the prescribable tolerance angle ε<15°.

3. The magneto-optic current sensor as claimed in claim 2, wherein the prescribable tolerance angle ε<5°.

4. The magneto-optic current sensor as claimed in claim 1, wherein the length of the fibre-optic λ/4 time delay element is selected such that the polarization components parallel to the optical main axes in the at least one λ/4 time delay element accumulate a phase difference of (2·m−1)·90°±δ, m being an integer and δ a prescribable tolerance angle.

5. The magneto-optic current sensor as claimed in claim 4, wherein the prescribable tolerance angle δ<25°.

6. The magneto-optic current sensor as claimed in claim 5, wherein the prescribable tolerance angle δ<10°.

7. The magneto-optic current sensor as claimed in claim 1, wherein the capillary contains a vacuum or a protective gas for protecting the current sensor fiber of the at least one current sensor coil against moisture and/or chemically aggressive gases.

8. The magneto-optic current sensor as claimed in claim 1, wherein the at least one λ/4 time delay element is also mounted in the capillary.

9. The magneto-optic current sensor as claimed in claim 1, wherein a linear optical birefringence in the at least one current sensor coil does not exceed ±20°.

10. The magneto-optic current sensor as claimed in claim 1, wherein a linear optical birefringence in the at least one λ/4 time delay element does not exceed ±10°.

* * * * *